US007586081B2

(12) United States Patent
Yamaguchi et al.

(10) Patent No.: US 7,586,081 B2
(45) Date of Patent: Sep. 8, 2009

(54) OUTPUT IMPEDANCE VARYING CIRCUIT

(75) Inventors: Hiroshi Yamaguchi, Osaka (JP); Masaki Taniguchi, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/076,788

(22) Filed: Mar. 24, 2008

(65) Prior Publication Data

US 2008/0179501 A1 Jul. 31, 2008

Related U.S. Application Data

(62) Division of application No. 11/329,029, filed on Jan. 11, 2006, now Pat. No. 7,365,302.

(30) Foreign Application Priority Data

Apr. 18, 2005 (JP) ............................ 2005-119382

(51) Int. Cl.
*G01J 1/44* (2006.01)
*H01J 40/14* (2006.01)
*H03F 3/08* (2006.01)

(52) U.S. Cl. .................................. 250/214 R; 327/330

(58) Field of Classification Search ............. 250/214 R, 250/214 A; 327/330; 326/127; 331/57
See application file for complete search history.

(56) References Cited

U.S. PATENT DOCUMENTS 5,357,089 A * 10/1994 Prentice ...................... 330/298
5,384,457 A 1/1995 Sommer
5,714,911 A * 2/1998 Gilbert ........................ 331/57
6,084,478 A 7/2000 Mayampurath
6,297,701 B1 10/2001 Visocchi et al.
6,307,196 B1 10/2001 Thompson et al.
6,344,780 B1 2/2002 Dobashi et al.
6,639,473 B1 10/2003 Kobayashi
6,664,858 B2 12/2003 Feng
6,693,463 B2 * 2/2004 Mateman .................... 326/127

FOREIGN PATENT DOCUMENTS

CN 1326545 A 12/2001
JP 62-264721 11/1987
JP 08335871 A 12/1996
JP 2001-320350 A 11/2001

OTHER PUBLICATIONS

Chinese Office Action issued in Chinese Patent Application No. CN 2006100076608 dated on Dec. 26, 2008.

* cited by examiner

*Primary Examiner*—Seung C Sohn
(74) *Attorney, Agent, or Firm*—McDermott Will & Emery LLP

(57) ABSTRACT

A photo detector IC (PDIC) is connected with a flexible printed circuit board (FPC). A signal converted into a voltage through light-to-voltage conversion in the PDIC is connected with the drain of a field effect transistor (FET), while the source of the FET is connected to an output terminal. A signal from the output terminal is input into a signal processing board of the main body via the FPC serving as an equivalent circuit composed of a coil and a capacitor. The gate of the FET is connected with a variable voltage source. Peaking occurs due to inductor components and capacitance components of the FPC. However, by application of voltage to the variable voltage source, the gate voltage value of the FET is adjusted to be an optimal value, whereby the peaking is suppressed by the on-resistance of the FET.

2 Claims, 4 Drawing Sheets

OUTPUT IMPEDANCE VARYING CIRCUIT

RELATED APPLICATIONS

This application is a Divisional of U.S. application Ser. No. 11/329,029, filed Jan. 11, 2006, now U.S. Pat. No. 7,365,302 claiming priority of Japanese Application No. 2005-119382, filed Apr. 18, 2005, the entire contents of each of which are hereby incorporated by reference.

BACKGROUND OF THE INVENTION

The present invention relates to an output impedance varying circuit for adjusting the output impedance of a photo detector IC in an apparatus for optically recording and playing back information.

In an apparatus for optically recording and playing back information, such as an optical disk drive or a magneto-optical disk drive, an optical pickup for converting light reflected from a disc into an electrical signal is composed of a lens for collecting mainly light, a photo detector IC (PDIC) which is a semiconductor device for converting an optical signal into a voltage, and a flexible printed circuit board (FPC) for establishing a connection from the PDIC to a signal processing board of the main body.

The output of the PDIC is input into the signal processing board of the main body via the FPC. The FPC can be expressed as an equivalent circuit composed of a coil and a capacitor. Therefore, in the input frequency characteristics of the signal processing board, peaking caused by the transfer characteristics of the circuit formed of the coil and the capacitor of the FPC appears. This peaking goes into an internal circuit of the PDIC through a parasitic element, a common impedance, or the like in the PDIC to change the frequency characteristics of the PDIC or to cause an operational amplifier in the PDIC to oscillate.

In a known transistor switching circuit, in order to adjust the frequency characteristics of an amplifier, a peaking circuit is electrically connected or disconnected with the amplifier according to a control signal (see Japanese Laid-Open Publication No. 62-264721).

To prevent peaking, an output resistor may be additionally provided in the PDIC. Specifically, in order to prevent peaking, the resistance value of the output resistor is optimized in accordance with the values of the coil and capacitor of the FPC connected with the PDIC.

Nevertheless, if the length of the FPC is changed due to new developments of optical pickups or the like, the inductance value and capacitance value of the FPC are changed. And in the case of a conventional resistance value, peaking occurs again or the input frequency characteristics of the signal processing board decrease to lower the level in the signal bandwidth.

If an output resistor is provided not in the PDIC but in the FPC, the cost of the optical pickup itself increases, while the increased number of components in the FPC results in increase in the size of the optical pickup itself.

SUMMARY OF THE INVENTION

An object of the present invention is to adjust the output impedance of a PDIC connected to a FPC, from outside of the PDIC in accordance with the inductance value and capacitance value of the FPC without attenuating a required signal bandwidth while suppressing occurrence of peaking.

In order to achieve the object, according to the present invention, an impedance varying circuit is inserted between an output circuit of a PDIC and an output terminal of the PDIC. The impedance varying circuit may be designed so as to adjust the on-resistance of a field effect transistor (FET), to include a plurality of parallel-connected or series-connected switching circuits each including a resistor, or to adjust the emitter resistance of one or more bipolar transistors.

DETAILED DESCRIPTION OF THE INVENTION

Hereinafter, embodiments of the present invention will be described in detail with reference to the accompanying drawings.

Figure 1:
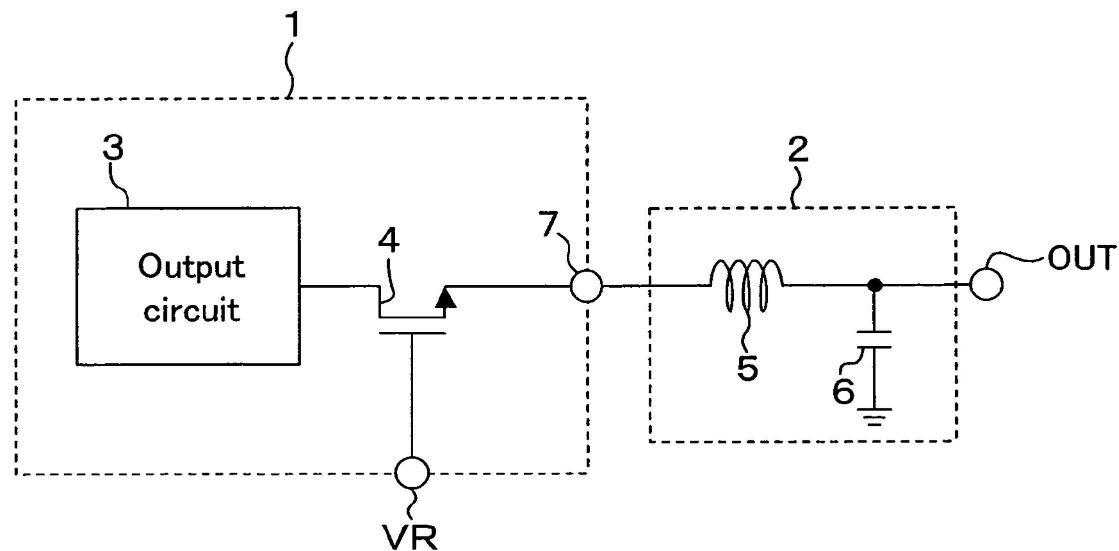
FIG. 1 is a circuit diagram illustrating an output impedance varying circuit according to a first embodiment of the present invention.

FIG. 1 illustrates an output impedance varying circuit according to a first embodiment of the present invention. In FIG. 1, the reference numeral 1 refers to the entire PDIC; 2 to a FPC equivalent circuit; 3 to an output circuit in the PDIC 1; 4 to a FET; 5 to a coil which is a lumped-constant element of inductor components of the FPC 2; 6 to a capacitor which is a lumped-constant element of capacitance components of the FPC 2; 7 to an output terminal of the PDIC 1; VR to a variable voltage source; and OUT to an output terminal of the FPC 2.

The PDIC 1 of FIG. 1 performs light-to-voltage conversion. A signal converted into a voltage is produced from the output of the output circuit 3 and connected to the drain of the FET 4, while the source of the FET 4 is connected to the output terminal 7. A signal from the output terminal 7 is input into a signal processing board of the main body through the FPC 2 composed of the coil 5 and the capacitor 6. The gate of the FET 4 is connected to the variable voltage source VR. In the FPC 2, peaking occurs due to the coil 5 and the capacitor 6, which are equivalent to the inductor components and the capacitance components of the FPC 2, respectively. The frequency f of the peaking is expressed by the equation, $$f=1/(2\pi(L\times C)^{1/2}),$$

where L represents the inductor value of the coil 5 and C represents the capacitance value of the capacitor 6.

Then, voltage is applied to the variable voltage source VR so as to apply voltage to the gate of the FET 4 and thereby turn on the FET 4. At this time, the on-resistance of the IS FET 4 occurs between the drain and source of the FET 4. By this on-resistance, the amount of peaking caused by the coil 5 and the capacitor 6 can be reduced. It can be understood that this is because the on-resistance of the FET 4 and the capacitor 6 form a filter circuit. If the gate voltage of the FET 4 is adjusted so that the on-resistance of the FET 4 has an optimal value, it is possible to suppress the occurrence of peaking without attenuation of the signal bandwidth.

Figure 2:
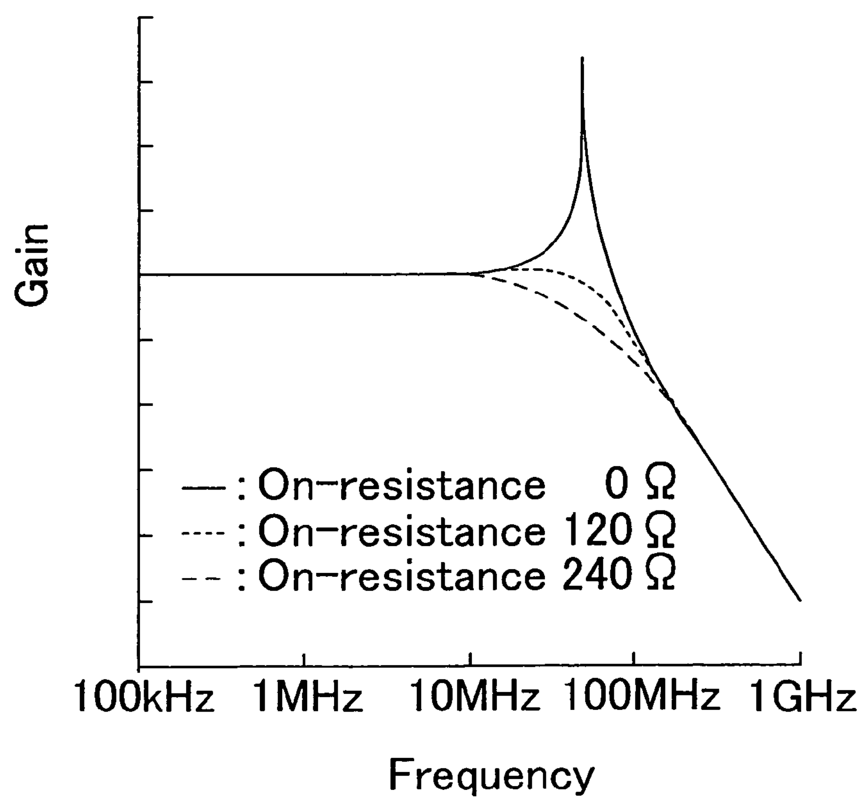
FIG. 2 shows frequency characteristics obtained when the on-resistance of a FET in the output impedance varying circuit of FIG. 1 is changed.

FIG. 2 shows an example of simulation results for the frequency characteristics of the configuration illustrated in FIG. 1. FIG. 2 shows the frequency characteristics obtained when the on-resistance of the FET 4 is 0Ω, 120Ω, and 240Ω, respectively, with the inductor value of the coil 5 of FIG. 1 being 300 nH and the capacitance value of the capacitor 6 of FIG. 1 being 30 pF. When the on-resistance of the FET 4 is 0Ω, sharp peaking occurs, and when the on-resistance is 120Ω, peaking disappears. When the on-resistance of the FET 4 is 240Ω, the frequency characteristics are low, causing attenuation of the signal bandwidth. These results show that 120Ω is the optimal value. If the length of the FPC 2 is changed, the voltage value of the variable voltage source VR may be adjusted so that the on-resistance of the FET 4 has an optimal value.

Figure 3:
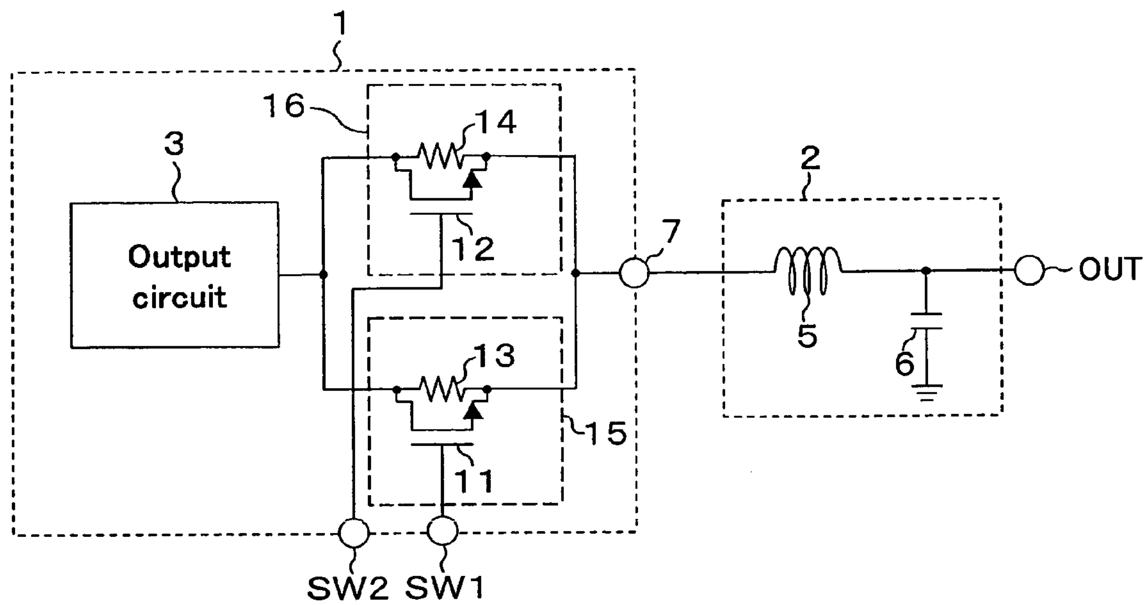
FIG. 3 is a circuit diagram illustrating an output impedance varying circuit according to a second embodiment of the present invention.

FIG. 3 illustrates an output impedance varying circuit according to a second embodiment of the present invention. In FIG. 3, the reference numerals 11 and 12 refer to FETs; 13 and 14 to resistors; 15 and 16 to switching circuits; and SW1 and SW2 to signals on switching terminals for turning on/off the FETs 11 and 12.

Between the output circuit 3 and the output terminal 7, the switching circuits 15 and 16 are connected in parallel. In the switching circuit 15, the resistor 13 is connected in parallel between the drain and source of the FET 11. In the switching circuit 16, the resistor 14 is connected in parallel between the drain and source of the FET 12. By controlling SW1 and SW2, the FETs 11 and 12 are turned on/off, whereby peaking caused by the coil 5 and the capacitor 6 can be eliminated.

For example, assume that the inductor value of the coil 5 of FIG. 3 is 300 nH, the capacitance value of the capacitor 6 is 30 pF, and the on-resistance of the resistors 13 and 14 is 24106 . In order to eliminate peaking in the FPC 2, SW1 and SW2 are set to "L" so that the FETs 11 and 12 turn off, whereby the resultant impedance between the output circuit 3 and the output terminal 7 takes a resistance value obtained when the resistors 13 and 14 are connected in parallel. The output impedance is thus 120Ω. From this, it is found that the same effects as those of the first embodiment are achieved. If the length of FPC 2 is changed, the number of FETs to be turned on in the switching circuits 15 and 16 may be changed.

Although the configuration in which the two switching circuits 15 and 16 are connected in parallel has been described with reference to FIG. 3, three or more switching circuits may be connected in parallel.

Figure 4:
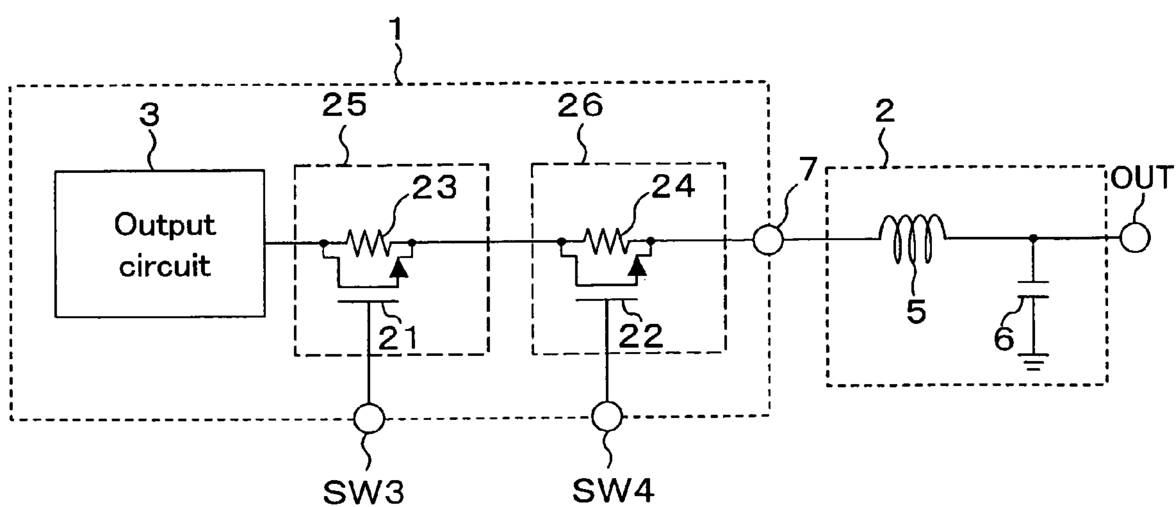
FIG. 4 is a circuit diagram illustrating an output impedance varying circuit according to a third embodiment of the present invention.

FIG. 4 illustrates an output impedance varying circuit according to a third embodiment of the present invention. In FIG. 4, the reference numerals 21 and 22 refer to FETs; 23 and 24 to resistors; 25 and 26 to switching circuits; and SW3 and SW4 to signals on switching terminals for turning on/off the FETs 21 and 22.

Between the output circuit 3 and the output terminal 7, the switching circuits 25 and 26 are connected in series. In the switching circuit 25, the resistor 23 is connected in parallel between the drain and source of the FET 21. In the switching circuit 26, the resistor 24 is connected in parallel between the drain and source of the FET 22. By controlling SW3 and SW4, the FETs 21 and 22 are turned on/off, whereby peaking caused by the coil 5 and the capacitor 6 can be eliminated.

For example, assume that the inductor value of the coil 5 of FIG. 4 is 300 nH, the capacitance value of the capacitor 6 is 30 pF, and the on-resistance of the resistors 23 and 24 is 120Ω. In order to eliminate peaking in the FPC 2, SW3 is set to "H" and SW4 is set to "L" so that the FET 21 turns on and the FET 22 turns off, whereby the resultant impedance between the output circuit 3 and the output terminal 7 takes the resistance value of the resistor 24. The output impedance is thus 120Ω. From this, it is found that the same effects as those of the first embodiment are achieved. If the length of FPC 2 is changed, the number of FETs to be turned on in the switching circuits 25 and 26 may be changed.

Although the configuration in which the two switching circuits 25 and 26 are connected in series has been described with reference to FIG. 4, three or more switching circuits may be connected in series.

Figure 5:
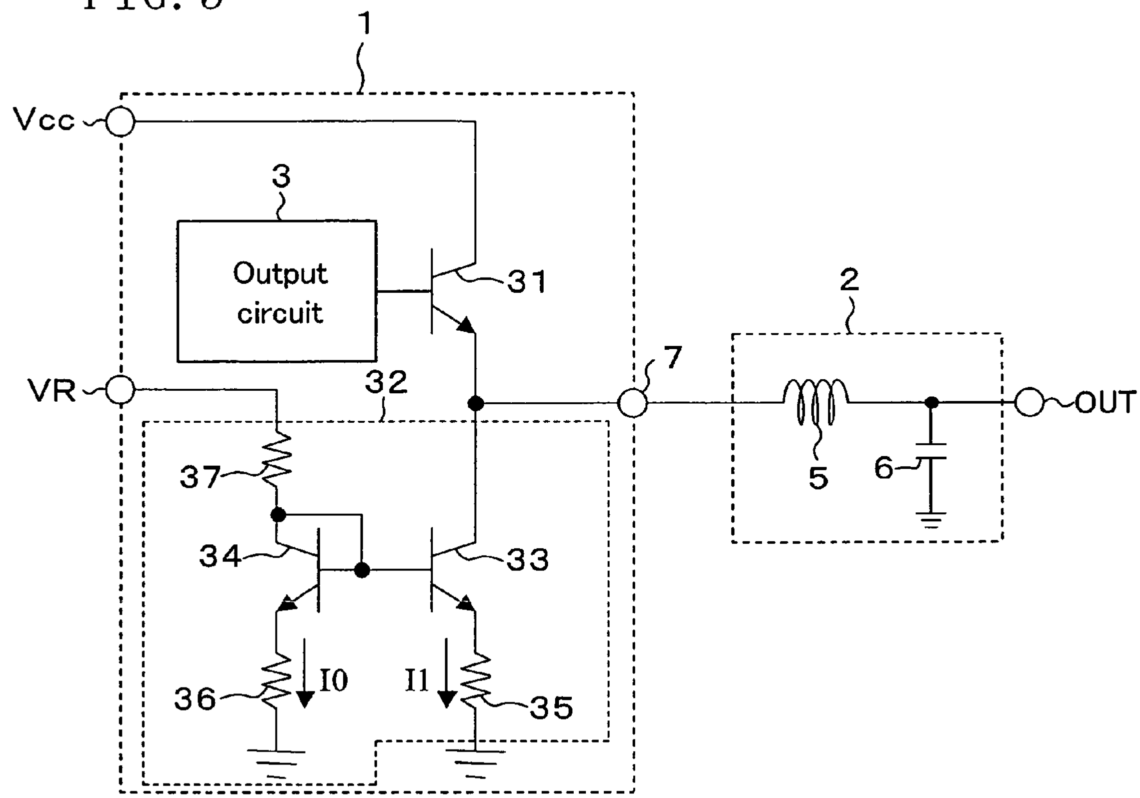
FIG. 5 is a circuit diagram illustrating an output impedance varying circuit according to a fourth embodiment of the present invention.

FIG. 5 illustrates an output impedance varying circuit according to a fourth embodiment of the present invention. In FIG. 5, the reference numeral 31 refers to an NPN transistor; 32 to a variable current source; 33 and 34 to NPN transistors; 35, 36 and 37 to resistors; Vcc to a power supply voltage source; and VR to a variable voltage source.

In the PDIC 1, the output of the output circuit 3 is input into the base of the NPN transistor 31, while the emitter of the NPN transistor 31 is connected to the variable current source 32 and the output terminal 7. That is, the NPN transistor 31 and the variable current source 32 form an emitter follower circuit. If the current value of the variable current source 32 is adjusted so that the emitter resistance of the NPN transistor 31 is optimized, it is possible to suppress peaking in the FPC 2.

To be more specific, the value of the base-emitter voltage VBE of the NPN transistor 34 is subtracted from the voltage value of the variable voltage source VR to obtain a voltage value, which is divided by the value of the resultant resistance of the resistors 37 and 36, thereby obtaining a current 10. The NPN transistors 33 and 34 and the resistors 35 and 36 form a current mirror circuit. The resistance value ratio between the resistors 36 and 35 determines a current I1, which is the emitter current of the NPN transistor 31. That is, the current I1 may be adjusted by controlling the voltage value of the variable voltage source VR so that the emitter resistance of the NPN transistor 31 is optimized.

For example, when the resistance of the resistors 35, 36 and 37 is 1 kΩ, VBE of the NPN transistors 33 and 34 is 0.7 V, and VR is 1.2 V, I0 is expressed by the equation, $$I0=(1.2V-0.7V)/(1\ k\Omega+1\ k\Omega)=250\ \mu A.$$

Since the resistance of the resistors 35 and 36 is 1 kΩ, the current mirror ratio is 1:1 and I1 is 250 μA. As a result, a current of 250 μA passes through the emitter of the NPN transistor 31. Therefore, when the inductor value of the coil 5 is 300 nH and the capacitance value of the capacitor 6 is 30 pF, the emitter resistance of the NPN transistor 31 will be 104Ω. From this, it is found that the same effects as those of the first embodiment are achievable.

If the values of the coil 5 and the capacitor 6 in the FPC 2 are changed and the location and amount of peaking in the FPC 2 are thereby changed, the voltage of the variable voltage source VR is changed so that the emitter resistance of the NPN transistor 31 is optimized, whereby the peaking can be eliminated.

FIG. 5 shows the configuration in which the NPN transistor 31 forms the emitter follower circuit. However, in cases where a PNP transistor is used, the same effects are also attainable.

Figure 6:
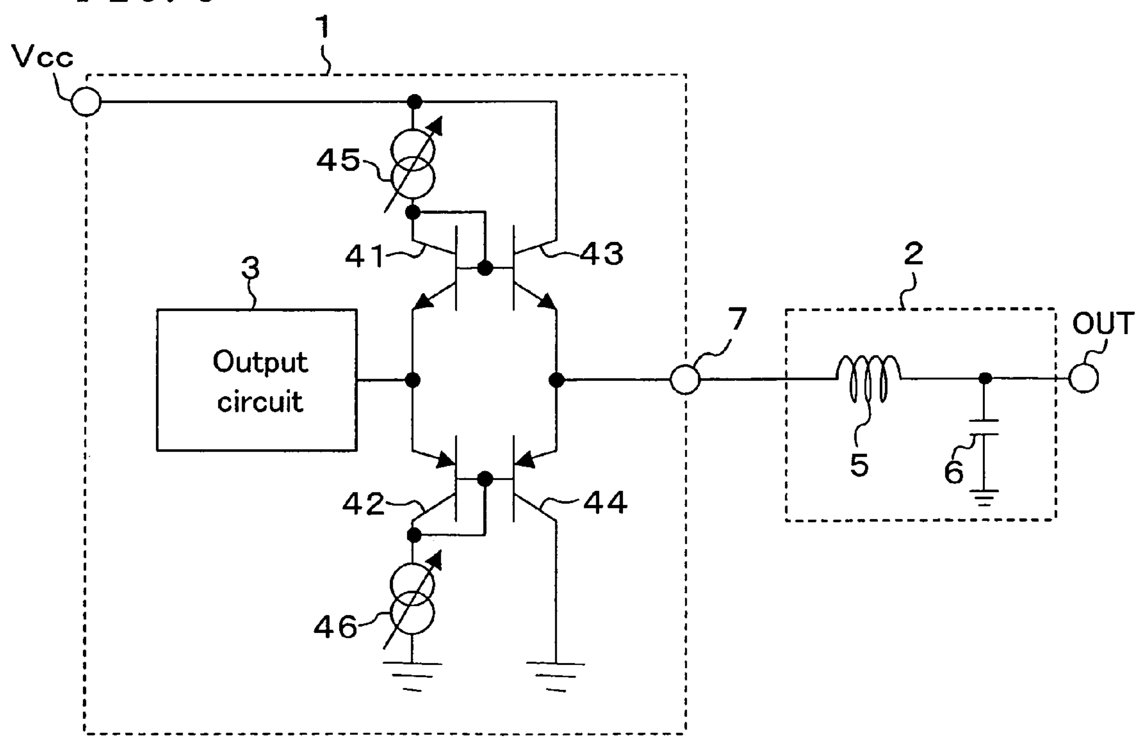
FIG. 6 is a circuit diagram illustrating an output impedance varying circuit according to a fifth embodiment of the present invention.

FIG. 6 illustrates an output impedance varying circuit according to a fifth embodiment of the present invention. In FIG. 6, the reference numerals 41 and 43 refer to NPN transistors; 42 and 44 to PNP transistors; and 45 and 46 to variable current sources.

The output of the output circuit 3 is connected to the respective emitters of the NPN and PNP transistors 41 and 42, while the collector and base of the NPN transistor 41 are connected to the variable current source 45 and the base of the NPN transistor 43, respectively. The collector and base of the PNP transistor 42 are connected to the variable current source 46 and the base of the PNP transistor 44, respectively. The respective emitters of the NPN and PNP transistors 43 and 44 are connected to the output terminal 7. The current values of the variable current sources 45 and 46 are adjusted so that the resultant resistance of the respective emitter resistances of the NPN and PNP transistors 43 and 44 is optimized, whereby it is possible to suppress peaking in the FPC 2.

For example, assume a case in which the inductor value of the coil 5 of FIG. 6 is 300 nH, the capacitance value of the capacitor 6 is 30 pF, the NPN transistors 41 and 43 have the same characteristics, the PNP transistors 42 and 44 have the same characteristics, and the variable current sources 45 and 46 each have a current value of 125 μA. In this case, a current of 125 μA passes through the emitter of the NPN transistor 43 to produce an emitter resistance of 208Ω, while a current of 125 μA passes through the emitter of the PNP transistor 44 to produce an emitter resistance of 208Ω. Therefore, the output impedance of the terminal 7, which is the resultant parallel resistance of the respective emitter resistances of the NPN and PNP transistors 43 and 44, will be 104Ω. From this, it is found that the same effects as those of the first embodiment are achieved.

Figure 7:
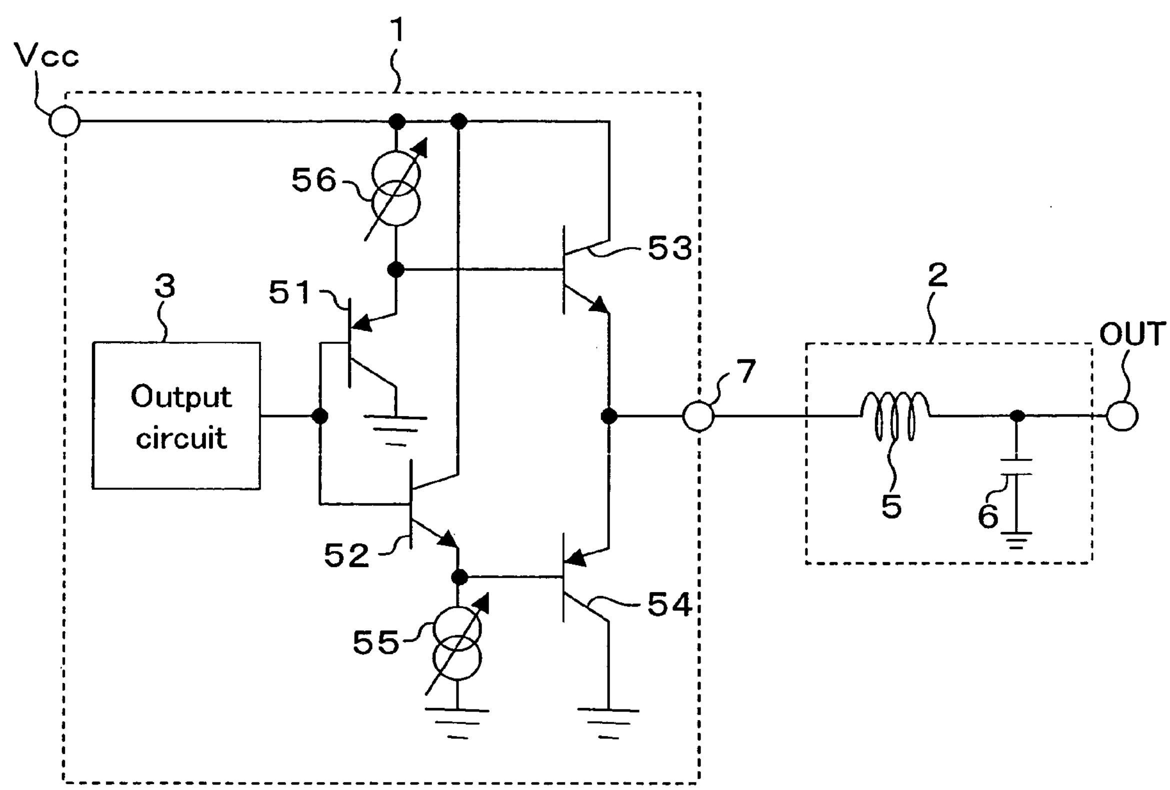
FIG. 7 is a circuit diagram illustrating an output impedance varying circuit according to a sixth embodiment of the present invention.

FIG. 7 illustrates an output impedance varying circuit according to a sixth embodiment of the present invention. In FIG. 7, the reference numerals 51 and 54 refer to PNP transistors; 52 and 53 to NPN transistors; and 55 and 56 to variable current sources.

The output of the output circuit 3 is connected to the respective bases of the PNP and NPN transistors 51 and 52. The emitter of the PNP transistor 51 is connected to the variable current source 56 and the base of the NPN transistor 53. The emitter of the NPN transistor 52 is connected to the variable current source 55 and the base of the PNP transistor 54. The respective emitters of the PNP and NPN transistors 54 and 53 are connected to the output terminal 7. The current values of the variable current sources 55 and 56 are adjusted so that the resultant resistance of the respective emitter resistances of the NPN and PNP transistors 53 and 54 is optimized, whereby it is possible to suppress peaking in the FPC 2.

For example, assume a case in which the inductor value of the coil 5 of FIG. 7 is 300 nH, the capacitance value of the capacitor 6 is 30 pF, the PNP transistors 51 and 54 have the same characteristics, the NPN transistors 52 and 53 have the same characteristics, and the variable current sources 55 and 56 each have a current value of 125 μA. In this case, a current of 125 μA passes through the emitter of the NPN transistor 53 to produce an emitter resistance of 208106 , while a current of 125 μA passes through the emitter of the PNP transistor 54 to produce an emitter resistance of 208106 . Therefore, the output impedance of the terminal 7, which is the resultant parallel resistance of the respective emitter resistances of the NPN and PNP transistors 53 and 54, will be 104106 . From this, it is found that the same effects as those of the first embodiment are achieved.

The output impedance varying circuits according the present invention are effective as means for suppressing peaking occurring due to inductor components and capacitance components in any FPC connected to the PDIC.

What is claimed is:

1. An output impedance varying circuit for adjusting an output impedance of a photo detector IC having an output terminal connected to a flexible printed circuit board in an apparatus for optically recording/playing back information, without causing attenuation of a required signal bandwidth while suppressing occurrence of peaking, the output impedance varying circuit comprising:

an output circuit of the photo detector IC, an impedance varying circuit provided between an output of the output circuit and the output terminal, a first NPN transistor having an emitter connected to the output of the output circuit and a collector and a base connected to a first variable current source, a first PNP transistor having an emitter connected to the output of the output circuit and a collector and a base connected to a second variable current source, a second NPN transistor having a base connected to the base of the first NPN transistor and an emitter connected to the output terminal, a second PNP transistor having a base connected to the base of the first PNP transistor and an emitter connected to the output terminal; and a resultant resistance of an emitter resistance of the second NPN transistor and an emitter resistance of the second PNP transistor is adjusted by current values of the first and second variable current sources.

2. An output impedance varying circuit for adjusting an output impedance of a photo detector IC having an output terminal connected to a flexible printed circuit board in an apparatus for optically recording/playing back information, without causing attenuation of a required signal bandwidth while suppressing occurrence of peaking, the output impedance varying circuit comprising:

an output circuit of the photo detector IC, an impedance varying circuit provided between an output of the output circuit and the output terminal, a first PNP transistor having a base connected to the output of the output circuit and an emitter connected to a first variable current source, a first NPN transistor having a base connected to the output of the output circuit and an emitter connected to a second variable current source, a second NPN transistor having a base connected to the emitter of the first PNP transistor and an emitter connected to the output terminal, a second PNP transistor having a base connected to the emitter of the first NPN transistor and an emitter connected to the output terminal; and a resultant resistance of an emitter resistance of the second NPN transistor and an emitter resistance of the second PNP transistor is adjusted by current values of the first and second variable current sources.

* * * * *